United States Patent
Kasar

(10) Patent No.: US 9,496,602 B2
(45) Date of Patent: Nov. 15, 2016

(54) PLASTIC ELECTRONIC DEVICE STRUCTURES WITH EMBEDDED COMPONENTS

(71) Applicant: Apple Inc., Cupertino, CA (US)

(72) Inventor: Darshan R. Kasar, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 235 days.

(21) Appl. No.: 14/263,749

(22) Filed: Apr. 28, 2014

(65) Prior Publication Data
US 2015/0313003 A1    Oct. 29, 2015

(51) Int. Cl.
| | |
|---|---|
| H05K 1/00 | (2006.01) |
| H05K 1/18 | (2006.01) |
| H05K 7/00 | (2006.01) |
| H01Q 1/24 | (2006.01) |
| H05K 3/28 | (2006.01) |
| H05K 9/00 | (2006.01) |
| H01Q 1/42 | (2006.01) |

(52) U.S. Cl.
CPC ............... *H01Q 1/243* (2013.01); *H01Q 1/42* (2013.01); *H05K 3/284* (2013.01); *H05K 9/0024* (2013.01); *H05K 1/189* (2013.01); *H05K 2201/09754* (2013.01); *H05K 2203/1316* (2013.01); *H05K 2203/1327* (2013.01); *H05K 2203/1476* (2013.01)

(58) Field of Classification Search
CPC .......... H01Q 1/00; H05K 1/028; H05K 1/11; H05K 1/189; H05K 2201/05; H05K 2201/09754; H05K 2201/10613; H05K 2203/1316; H05K 2203/1327; H05K 2203/1476; H05K 3/284; H05K 5/02; H05K 9/0024

See application file for complete search history.

(56) References Cited

U.S. PATENT DOCUMENTS

| | | | |
|---|---|---|---|
| 8,207,906 B2 | 6/2012 | Tiscareno et al. | |
| 8,482,118 B2 | 7/2013 | Mohan et al. | |
| 8,523,610 B2 | 9/2013 | Kuster | |
| 2007/0273014 A1* | 11/2007 | Lee | H01L 23/13 257/686 |
| 2010/0321871 A1* | 12/2010 | Diebel | G06F 1/1628 361/679.01 |
| 2011/0090626 A1 | 4/2011 | Hoellwarth et al. | |
| 2011/0128712 A1* | 6/2011 | Prest | G06F 1/1626 361/783 |
| 2012/0106037 A1* | 5/2012 | Diebel | G06F 1/1628 361/679.01 |
| 2012/0329524 A1 | 12/2012 | Kent et al. | |
| 2013/0076573 A1* | 3/2013 | Rappoport | H01Q 1/243 343/702 |
| 2013/0190052 A1 | 7/2013 | Lundell | |
| 2014/0028243 A1 | 1/2014 | Rayner | |
| 2014/0065948 A1* | 3/2014 | Huang | H05K 5/0086 455/7 |

OTHER PUBLICATIONS

Chang, U.S. Appl. 14/040,322, filed Sep. 27, 2013.

* cited by examiner

*Primary Examiner* — Yuriy Semenenko

(74) *Attorney, Agent, or Firm* — Treyz Law Group, P.C.; G. Victor Treyz; Zachary D. Hadd

(57) ABSTRACT

Circuitry such as electrical components and wires and traces on flexible printed circuits can be embedded within injection-molded plastic structures. The electrical components can include integrated circuits, connectors, and system-in-package circuit modules. The system-in-package circuit modules may include components mounted on a substrate and covered with plastic. The connectors may include a connector for mating with a corresponding connector on an electronic device or a battery. The injection-molded plastic structures may form a housing. The housing may form part of an electronic device, an external case that receives an electronic device, or other structures. A near-field communications antenna may be embedded within a plastic housing. Signal wires and plastic fibers may be interlaced to form a mesh that is embedded in the plastic housing or other injection molded plastic structure.

14 Claims, 14 Drawing Sheets

US 9,496,602 B2

PLASTIC ELECTRONIC DEVICE STRUCTURES WITH EMBEDDED COMPONENTS

BACKGROUND

This relates generally to electronic devices and, more particularly, to embedding components into plastic structures such as housings for electronic devices and external device cases.

Electronic devices such as computers, cellular telephones, and other electronic devices have housings. The housings are often formed from plastic. External cases such as rigid cases and foldable covers for electronic devices may also be formed from plastic.

It may be desirable to provide circuitry for an electronic device or external electronic device case that consumes minimal space. If the circuitry consumes too much space, an electronic device or case may become overly bulky. Unless care is taken, electronic devices and cases for electronic devices may also be unnecessarily sensitive to moisture. Device housings and external device cases often exhibit insufficient moisture resistance and are bulky.

It would therefore be desirable to be able to provide improved techniques for forming electronic devices and external cases.

SUMMARY

Circuitry such as electrical components and wires and traces on flexible printed circuits can be embedded within injection-molded plastic structures. The electrical components can include integrated circuits, connectors, and system-in-package circuit modules. The system-in-package circuit modules may include components mounted on a substrate and covered with molded plastic. Components may also be covered with thermoset adhesive. The connectors may include a connector for mating with a corresponding connector on an electronic device or a battery.

An injection-molded plastic structure may form a housing. The housing may form part of an electronic device, part of an external case that receives an electronic device, or other structure. When embedding circuitry within the injection-molded plastic structure, portions of the embedded circuitry may protrude out from the injection-molded plastic and may therefore be left uncovered by plastic. Other portions of the circuitry may be covered by the injection-molded plastic.

A near-field communications antenna may be embedded within a plastic housing. The near-field communications antenna may be formed from loops of wire or other signal lines.

Signal wires and plastic fibers may be interlaced to form a mesh that is embedded in the plastic housing or other injection molded plastic structure. The signal wires may convey signals between integrated circuits and other electrical components. These components may be mounted on flexible printed circuits having portions that are embedded within the injection-molded plastic.

DETAILED DESCRIPTION

Circuitry such as signal lines and electrical components can be embedded within injection-molded plastic. The plastic may be used in forming an electronic device housing or a housing structure or other structure for an external case that receives an electronic device. The case may, for example, contain plastic walls and other structures that included embedded flexible printed circuits, wires, connectors, electronic devices, and other circuitry.

Illustrative electronic devices of the type that may include circuitry embedded within plastic housing walls or other plastic structures are shown in FIGS. 1-4.

Figure 1:
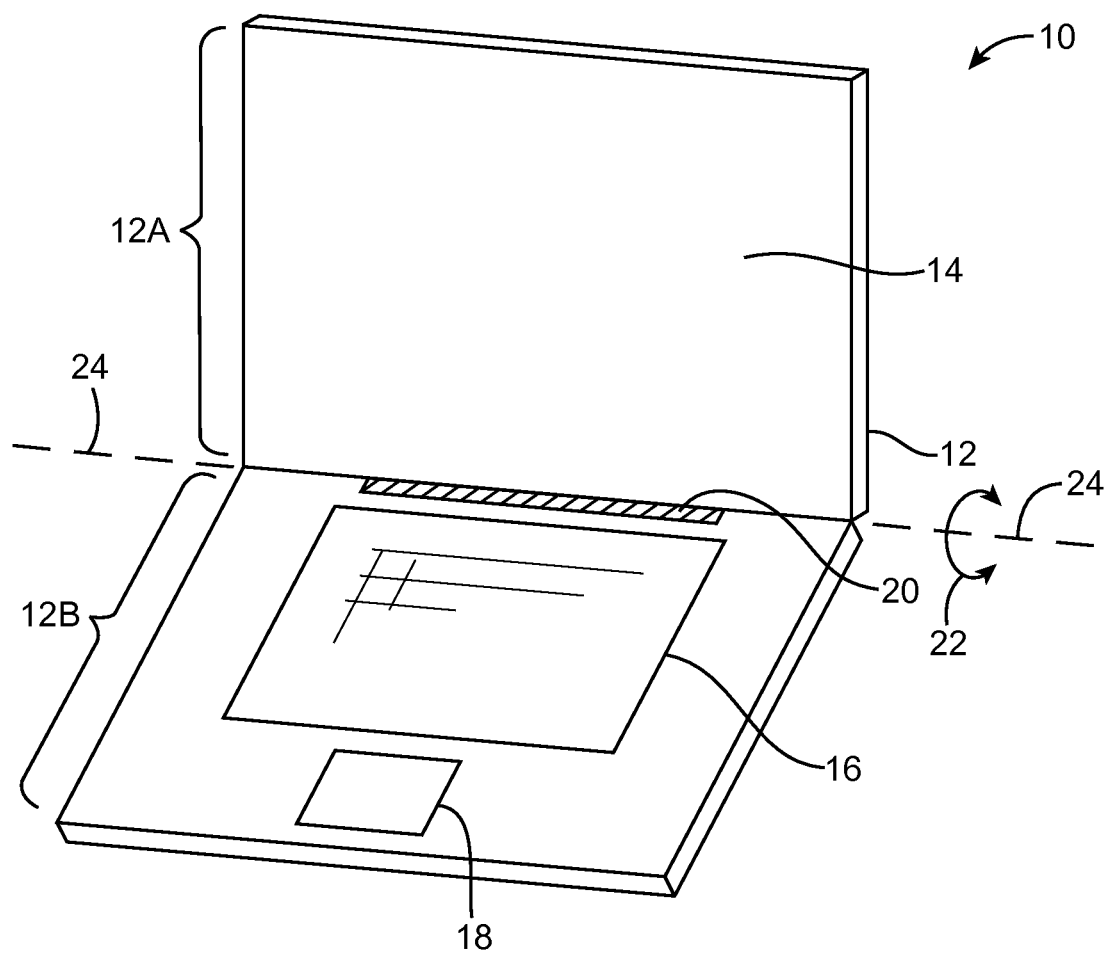
FIG. 1 is a perspective view of an illustrative electronic device such as a laptop computer in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes referred to as a display housing or lid, is placed in a closed position by rotating upper housing 12A towards lower housing 12B about rotational axis 24.

Figure 2:
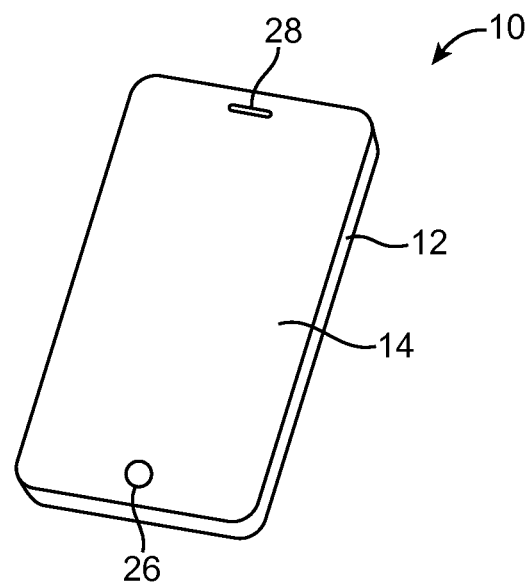
FIG. 2 is a perspective view of an illustrative electronic device such as a handheld electronic device in accordance with an embodiment.

FIG. 2 shows an illustrative configuration for electronic device 10 based on a handheld device such as a cellular telephone, music player, gaming device, navigation unit, or other compact device. In this type of configuration for device 10, device 10 has opposing front and rear surfaces. A planar portion of housing 12 of device 10 may form the rear surface for device 10. Display 14 may form the front surface of device 10. Display 14 may have an outermost layer that includes openings for components such as button 26 and speaker port 28.

Figure 3:
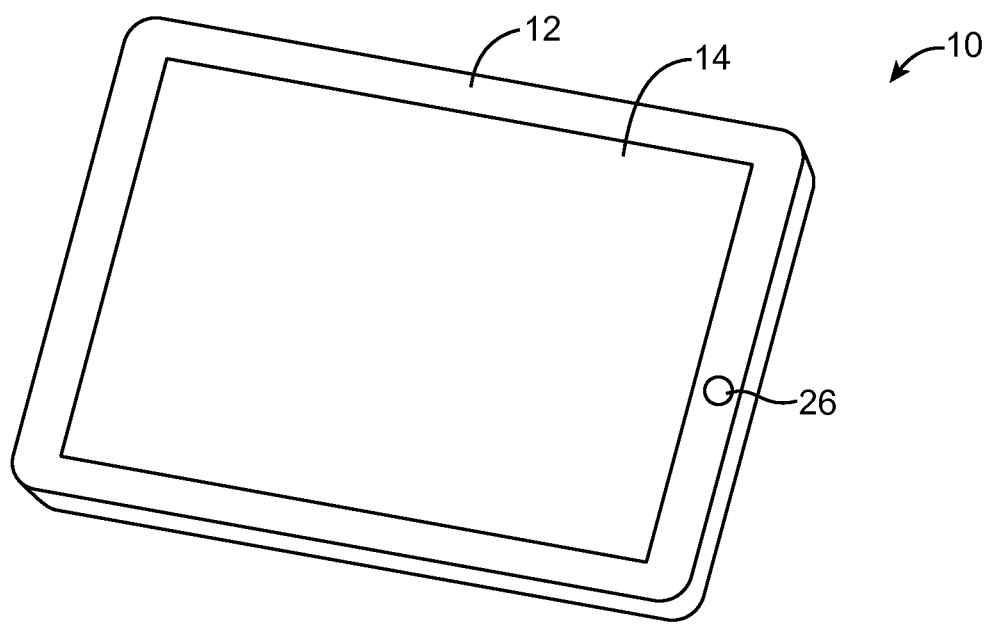
FIG. 3 is a perspective view of an illustrative electronic device such as a tablet computer in accordance with an embodiment.

In the example of FIG. 3, electronic device 10 is a tablet computer. In electronic device 10 of FIG. 3, device 10 has opposing planar front and rear surfaces. The rear surface of device 10 is formed from a planar rear wall portion of housing 12. Curved or planar sidewalls may run around the periphery of the planar rear wall and may extend vertically upwards. Display 14 is mounted in housing 12 and forms the front surface of device 10. As shown in FIG. 3, display 14 has an outermost layer with an opening to accommodate button 26.

Figure 4:
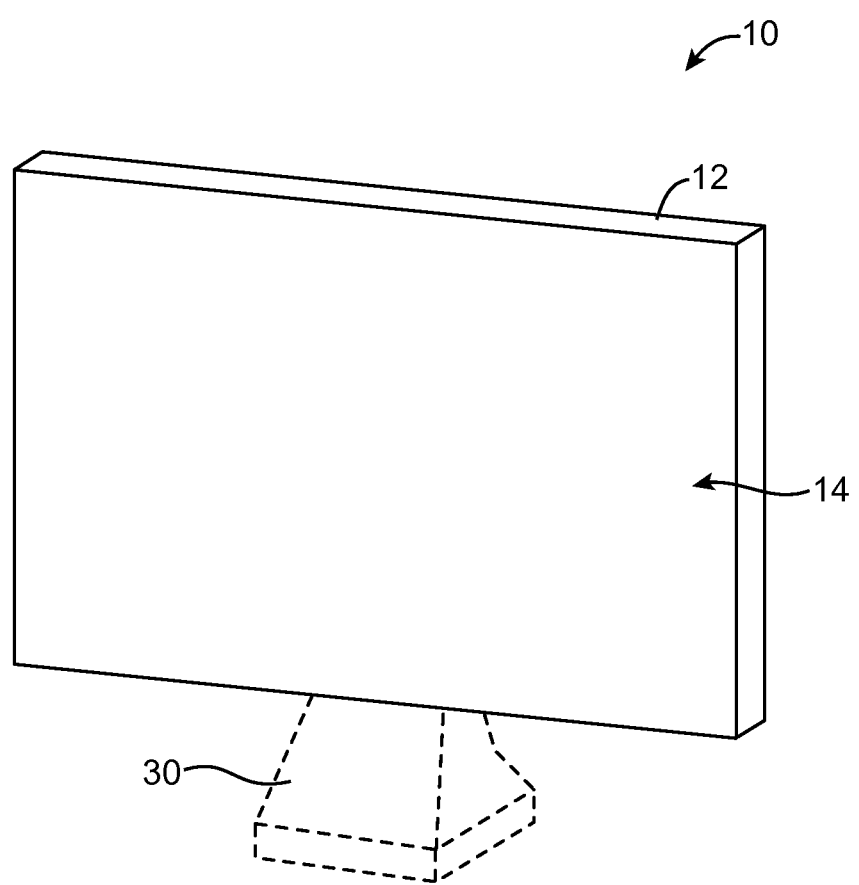
FIG. 4 is a perspective view of an illustrative electronic device such as a computer or other equipment with a display in accordance with an embodiment.

FIG. 4 shows an illustrative configuration for electronic device 10 in which device 10 is a computer display, a computer that has an integrated computer display, or a television. Display 14 is mounted on a front face of device 10 in housing 12. With this type of arrangement, housing 12 for device 10 may be mounted on a wall or may have an optional structure such as support stand 30 to support device 10 on a flat surface such as a tabletop or desk.

An electronic device such as electronic device 10 of FIGS. 1, 2, 3, and 4, may, in general, be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, an external case such as a cover with a flexible hinge or other cases that receives an additional electronic device, equipment that implements the functionality of two or more of these devices, or other electronic equipment. The examples of FIGS. 1, 2, 3, and 4 are merely illustrative.

Device 10 may include a display such as display 14. Display 14 may be mounted in housing 12. Housing 12 may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). In configurations in which housing 12 is formed at least partly from a polymer such as injection molded plastic, circuitry can be embedded within housing 12.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button, an opening may be formed in the display cover layer to accommodate a speaker port, etc.

Figure 5:
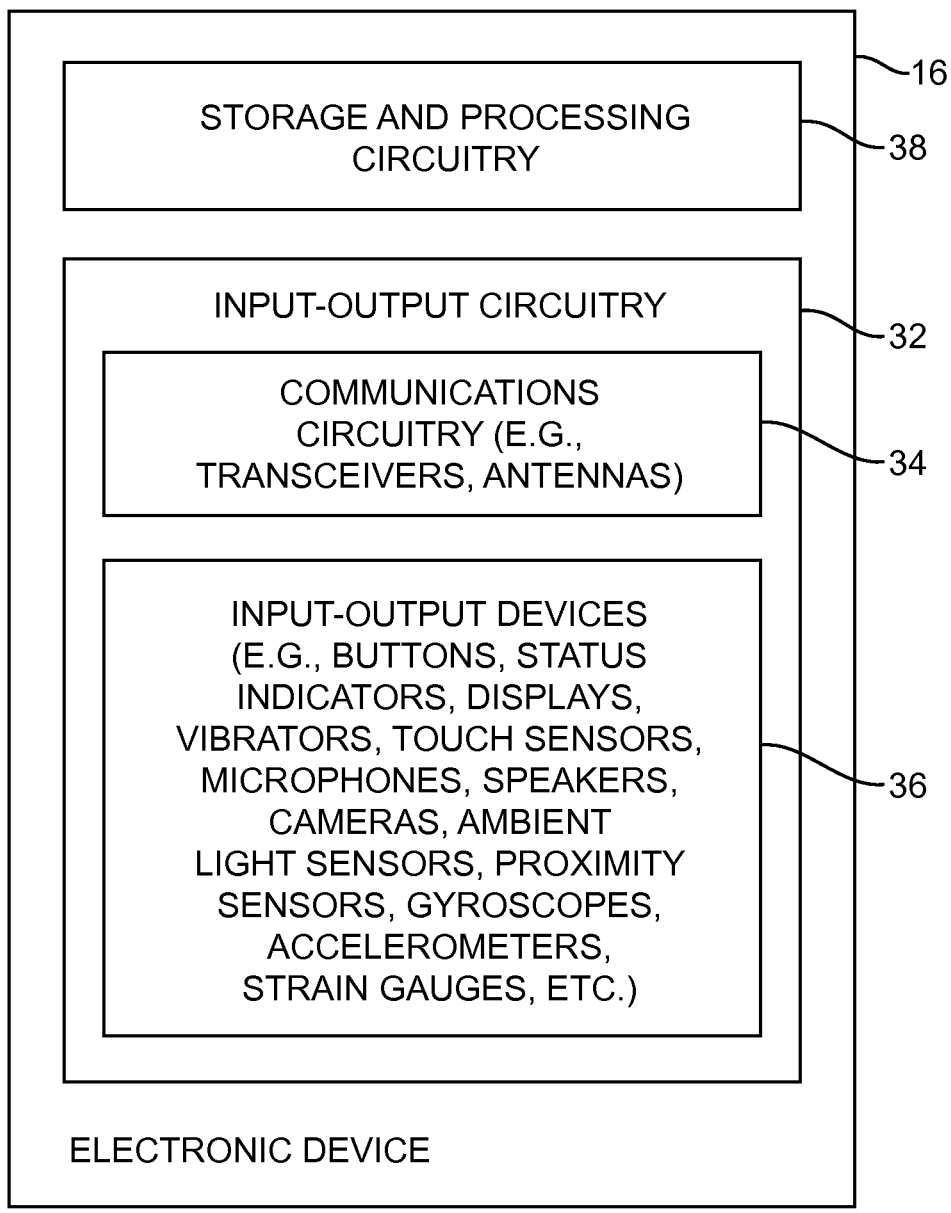
FIG. 5 is a schematic diagram of illustrative circuitry in an electronic device in accordance with an embodiment.

A schematic diagram of an illustrative device such as devices 10 of FIGS. 1, 2, 3, and 4 is shown in FIG. 5. As shown in FIG. 5, electronic device 10 may include control circuitry such as storage and processing circuitry 38. Storage and processing circuitry 38 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 38 may be used in controlling the operation of device 10. The processing circuitry may be based on a processor such as a microprocessor and other suitable integrated circuits. With one suitable arrangement, storage and processing circuitry 38 may be used to run software on device 10, such as internet browsing applications, email applications, media playback applications, operating system functions, software for capturing and processing images, software implementing functions associated with gathering and processing sensor data such as stress data, etc.

Input-output circuitry 32 may be used to allow data to be supplied to device 10 and to allow data to be provided from device 10 to external devices. Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. The transceiver circuitry and antennas in communications circuitry 34 may include near-field communications transceiver circuitry (e.g., a transceiver operating at a frequency of 13.56 MHz or other suitable near-field communications frequency) and near-field communications antennas for supporting near-field communications with external equipment.

Input-output circuitry 32 may include input-output devices 36. Input-output devices 36 may include devices such as buttons (see, e.g., button 26 of FIGS. 2 and 3), joysticks, click wheels, scrolling wheels, a touch screen (see, e.g., display 14), other touch sensors such as track pads (see, e.g., track pad 18 of FIG. 1), touch-sensor-based buttons, vibrators, audio components such as microphones and speakers, image capture devices such as a camera module having an image sensor and a corresponding lens system, keyboards, status-indicator lights, tone generators, key pads, strain gauges, proximity sensors, ambient light sensors, capacitive proximity sensors, light-based proximity sensors, gyroscopes, accelerometers, magnetic sensors, temperature sensors, fingerprint sensors, and other equipment for gathering input from a user or other external source and/or generating output for a user.

Figure 6:
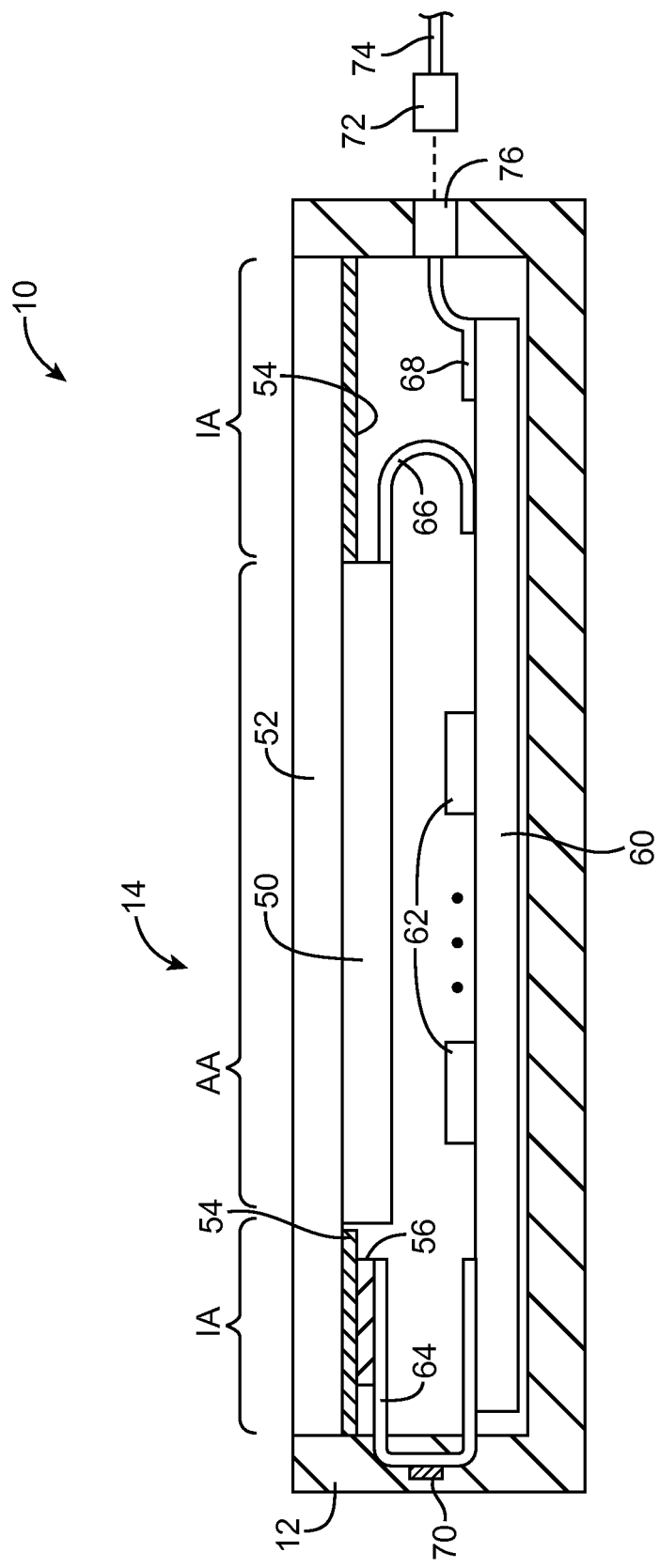
FIG. 6 is a cross-sectional side view of an illustrative electronic device in accordance with an embodiment.

A cross-sectional side view of an illustrative electronic device such as device 10 of FIGS. 1, 2, 3, 4, and 5 is shown in FIG. 6. As shown in the illustrative configuration of FIG. 6, device 10 may have a display such as display 14 that is mounted on the front face of device 10. Display 14 may have a display cover layer such as cover layer 52 and a display module such as display module 50. Display cover layer 52 may be formed from a glass or plastic layer. Display module 50 may be, for example, a liquid crystal display module or an organic light-emitting diode display layer (as examples). Display module 50 may have a rectangular outline when viewed from the front of device 10 and may be mounted in a central rectangular active area AA on the front of device 10 or may have other suitable shapes. An inactive area IA that forms a border for display 14 may surround active area AA. Opaque masking material such as black ink 54 may be used to coat the underside of cover layer 52 in inactive area IA.

Device 10 may include components such as components 62 that are mounted on one or more printed circuits such as printed circuit 60. Printed circuit board 60 may have one or more layers of dielectric material and one or more layers of metal traces. Printed circuit 60 of FIG. 6 may be a rigid printed circuit board (e.g., a printed circuit formed form a rigid printed circuit board material such as fiberglass-filled epoxy) or a flexible printed circuit (e.g., a printed circuit formed from a flexible sheet of polyimide or other flexible polymer substrate layer). Components 62 may include circuits such as the circuits of storage and processing circuitry 38 and/or input-output circuitry 32 of FIG. 5. Components 62 may be, for example, integrated circuits, discrete components such as capacitors, resistors, and inductors, switches, connectors, sensors, input-output devices such as status indicators lights, audio components, or other electrical and/or mechanical components for device 10. Components 62 may be attached to printed circuit 60 using solder, welds, anisotropic conductive film or other conductive adhesives, or other conductive connections. One or more layers of patterned metal interconnects (i.e., copper traces or metal traces formed from other materials) may be formed within one or more dielectric layers in printed circuit 60 to form signal lines that route signals between components 62.

If desired, device 10 may have components mounted on the underside of display cover layer 52 such as illustrative component 56 on opaque masking layer 54 in inactive area IA of device 10 of FIG. 6. Component 56 may be a touch sensor, a fingerprint sensor, a strain gauge sensor, a button, or other input-output device 36 (as examples). Device 10 may also have one or more connectors such as connector 76. Connector 76 may be an audio connector, a digital data port connector, or other connector. Connector 76 may mate with a corresponding connector such as connector 72. Connector 72 may form part of external equipment (shown schematically as structure 74). For example, connector 72 may be part of a cable, part of an external dock or case into which device 10 is mounted, or may be any other connector that mates with connector 76 of device 10.

Device 10 may include one or more flexible printed circuits such as illustrative flexible printed circuits 64, 66, and 68. The flexible printed circuits may have layers of dielectric and layers of metal traces. The metal traces of a flexible printed circuit may be used to form signal paths to interconnect the circuitry of device 10 and/or external circuitry. For example, flexible printed circuit 64 may have signal paths that interconnect component 56 to the circuitry of components 62 on printed circuit 60, flexible printed circuit 66 may have signal paths that couple display module 50 to components 62 on printed circuit 60, and flexible printed circuit 68 may have signal paths for interconnecting connector 76 (which is mounted to flexible printed circuit 68) with the components in device 10 such as components 62.

As shown in FIG. 6, signal paths (e.g., wires, flexible printed circuits, etc.) such as flexible printed circuit 64 can be embedded within the material that makes up housing 12. For example, some or all of housing 12 may be made up of injection molded plastic. Flexible printed circuit 64 or other structures (e.g., wires, etc.) may be partly or fully embedded within the injection molded plastic. If desired, one or more components may be mounted on a flexible printed circuit that is embedded in plastic such as flexible printed circuit 64. For example, component(s) 70 may be soldered to flexible printed circuit 64 or may be otherwise mounted on flexible printed circuit 64 prior to injection molding. During injection molding operations, plastic housing material for housing 12 may be injection molded over component 70 and flexible printed circuit 64 as shown in FIG. 6.

If desired, plastic may be injected molded over circuitry when forming part of a housing wall or other structure in a separate external case for device 10. An external case may have an interior portion or other portion that is configured to receive an electronic device. When the device is installed with the case, the case can help protect the device. The case can also provide supplemental power or other features. When the case is not needed, it can be removed by a user.

Figure 7:
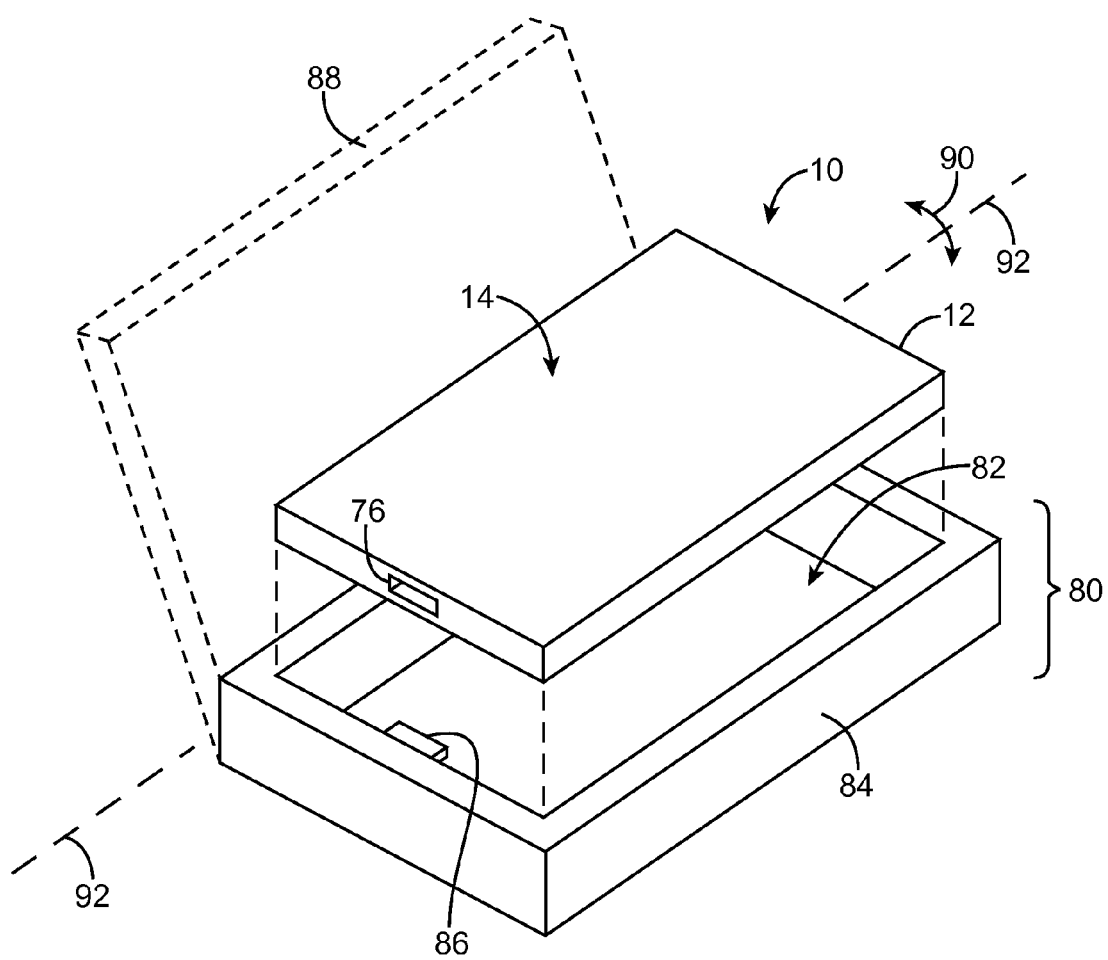
FIG. 7 is a perspective view of an illustrative electronic device and associated external case in accordance with an embodiment.

An illustrative external case for an electronic device is shown in FIG. 7. As shown in FIG. 7, electronic device 10 may have housing 12 and connector 76. Device 10 may have a rectangular shape or other suitable shape. In the example of FIG. 7, device 10 has a housing with opposing front and rear surfaces surrounded by four peripheral edges. External case 80 has a housing such as body 84. Body 84 may have a shape that defines an inner cavity such as recess 82. Recess 82 may have the shape of a rectangular depression that is configured to receive device 10. For example, recess 82 may have a rectangular shape with four inner edges that mate with the four peripheral edges of housing 12 of device 10. When device 10 is received within recess 82 or other mating structures in case 80 (e.g., structures in body member 84 of case 80 or other structures), device connector 76 may mate with a corresponding connector in case 80 such as case connector 86. This may allow device 10 and case 80 to communicate and/or share power. For example, device 10 and case 80 can each send and receive analog and/or digital data signals through connectors 76 and 86. Power supply signals can also flow through connectors 76 and 86. Case 84 may, as an example, contain a power source such as a battery that supplies auxiliary power to device 10 through connectors 86 and 76.

Case 80 may have an optional front flap such as flap 88. Flap 88 may rotate about a flexible body portion or hinge that is aligned along hinge axis 92. For example, flap 88 may be rotated about axis 92 relative to the rest of body 84 when it is desired to open flap 88 (to uncover device 10) or close flap 88 (to cover device 10). Cases such as illustrative case 80 of FIG. 7 may sometimes be referred to as covers. Because case 80 may contain connector 86 and other circuit components, case 80 may also sometimes be referred to as an electronic device. Case 80 of FIG. 7 has a configuration that allows case 80 to help protect device 10 from the surrounding environment. If desired, an external accessory such as case 80 may have other shapes (e.g., the shape of a dock into which device 10 can be inserted, etc.). Such external accessories may have plastic structures such as injection-molded plastic housing walls that enclose portions of connector 86 and other components. Configurations in which device 80 is an external case for device 10 are sometimes described herein as an example.

Figure 8:
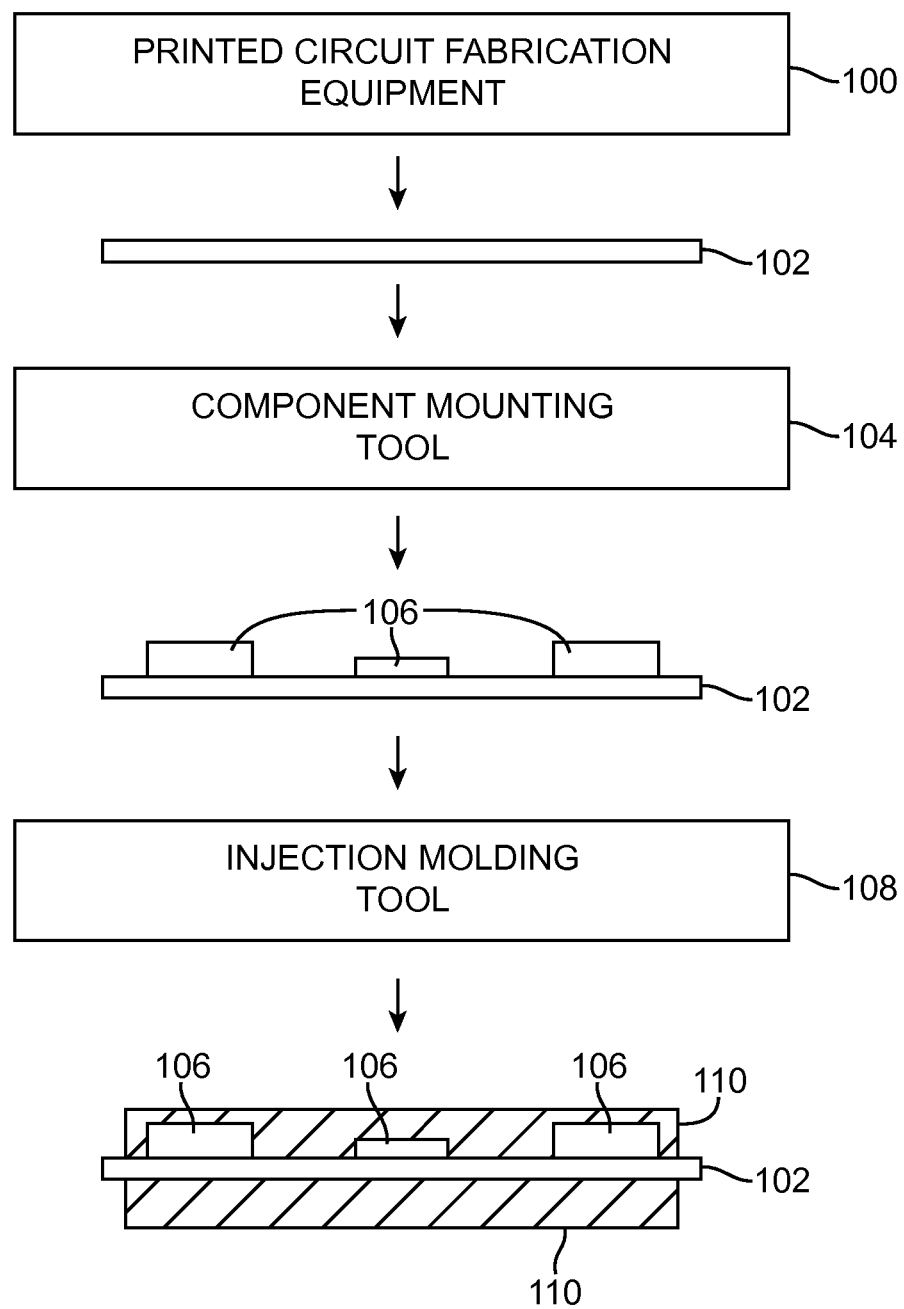
FIG. 8 is a diagram showing illustrative equipment and operations involved in overmolding plastic onto electrical components and associated interconnects in accordance with an embodiment.

Fabrication equipment of the type used when embedding circuitry within plastic for device 10 or structures that are used with device 10 such as external case 80 or other equipment is shown in FIG. 8.

Initially, a flexible printed circuit such as flexible printed circuit 102 or other printed circuit may be formed using printed circuit fabrication equipment 100. Printed circuit fabrication equipment 100 may include equipment for patterning metal traces on one or more layers of dielectric printed circuit substrate material and equipment for laminating together the layers of substrate material to form flexible printed circuit 102. Equipment 100 may include photolithography equipment, etching equipment, printing equipment, electroplating equipment, physical vapor deposition equipment, and other equipment for patterning metal traces for signal lines onto one or more layers of material in a dielectric substrate.

One or more electrical components 106 may be mounted on substrate 102 using computing mounting tool 104. Components 106 may include circuitry such as the circuitry of storage and processing circuitry 38 and the circuitry of input-output circuitry 32 of FIG. 5. Mounting tool 104 may include equipment for soldering components 106 to substrate 102 or other equipment for attaching components 106 to substrate 102.

After printed circuit 102 has been populated with any desired components 106, injection molding tool 108 (e.g., a heated die) may be used to injection mold plastic 110 over the upper and/or lower surfaces of printed circuit 102, as shown in FIG. 8. Plastic 110 may be a thermoplastic or other suitable polymer. Plastic 110 may be injection molded into the shape of all or some of housing 12 of device 10, all or some of body 84 of case 80, or other suitable shape. The ability to embed interconnects such as the metal traces on flexible printed circuit 102 within plastic 110 and the ability to embed circuit components such as components 106 within plastic 110 allows the circuitry of components 106 and printed circuit 102 to be protected from moisture and helps minimize device size while potentially enhancing device aesthetics (see, e.g., printed circuit 64 of FIG. 6).

Figure 9:
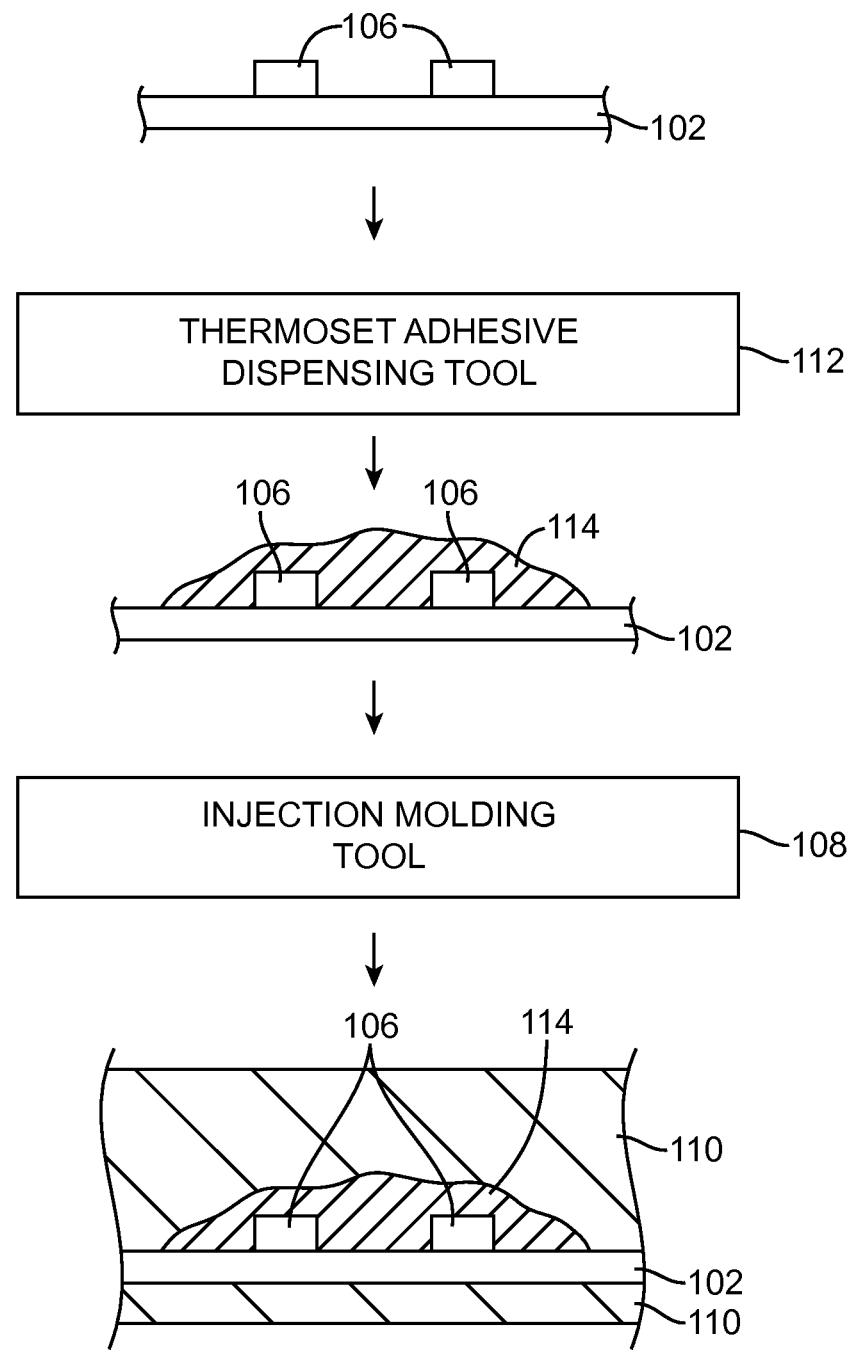
FIG. 9 is a diagram showing how component on a circuit substrate may be covered with a thermoset polymer before being embedded within an injection molded thermoplastic material in accordance with an embodiment.

If desired, one or more additional polymer materials may be used to cover circuitry such as printed circuit 102 and components 106. For example, a thermoset polymer (e.g., a thermoset adhesive such as an acrylic thermoset adhesive or an epoxy thermoset adhesive) may be used in covering components 106 and a portion of printed circuit 102. This type of arrangement is shown in FIG. 9.

Initially, flexible printed circuit 102 may be patterned and components 106 may be mounted on flexible printed circuit 102, as described in connection with the use of printed circuit fabrication equipment 100 and component mounting tool 104 of FIG. 8. After components 106 have been mounted on printed circuit 102, thermoset adhesive dispensing equipment such as tool 112 may be used to cover components 106 and/or printed circuit 102 with thermoset adhesive 114. Thermoset adhesive dispensing tool 112 may be a nozzle or other equipment for applying adhesive 114 (e.g., by spraying, dripping, slit dispensing, molding such as injection molding, etc.). Adhesive 114 may be cured by heat applied in an oven, ultraviolet light curing, room temperature curing, or other curing techniques.

After components 106 and/or printed circuit 102 have been covered with thermoset adhesive 114, injection molding tool 108 may be used to injection mold thermoplastic polymer 110 over some or all of printed circuit 102, components 106, and cured thermoset adhesive 114, as described in connection with FIG. 8.

Figure 10:
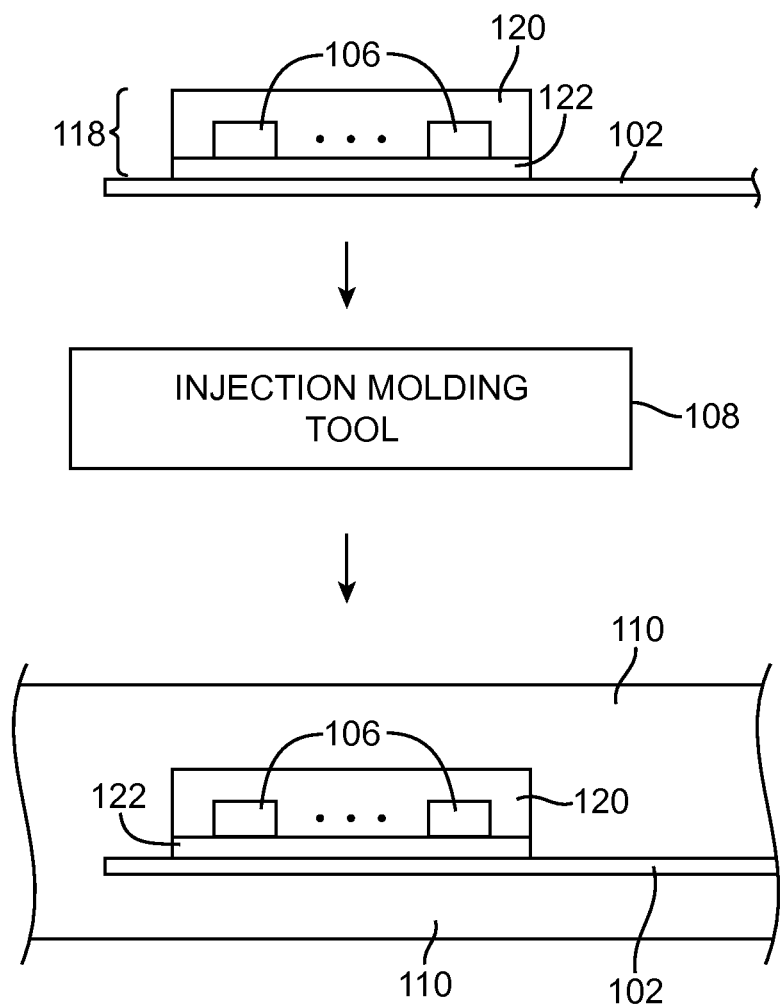
FIG. 10 is a diagram showing how a circuit module such as a system-in-package module may be embedded within injected-molded plastic in accordance with an embodiment.

FIG. 10 shows how a system-in-package circuit module may be embedded within plastic 110. System-in-package module 118 may be formed by mounting electrical components 106 on system-in-package substrate 122 and covering substrate 122 and components 106 with dielectric 120 (e.g., molded plastic). Electrical components 106 of system-in-package module 118 may be integrated circuits or other circuit components (e.g., circuitry such as the circuitry of FIG. 5). Substrate 122 may be a rigid printed circuit board or other substrate (e.g., a substrate of plastic, ceramic, etc.). Following formation of system-in-package module 118, module 118 may be soldered to flexible printed circuit 102 or otherwise mounted to printed circuit 102.

Injection molding tool 108 may be used to cover system-in-package module 118 and/or flexible printed circuit with injection molded thermoplastic polymer 110, as described in connection with FIG. 8. As with the configurations of FIGS. 8 and 9, plastic 110 may form part of housing 12 of device 10, may form part of body 84 of case 80, or may form part of other device structures.

Figure 11:
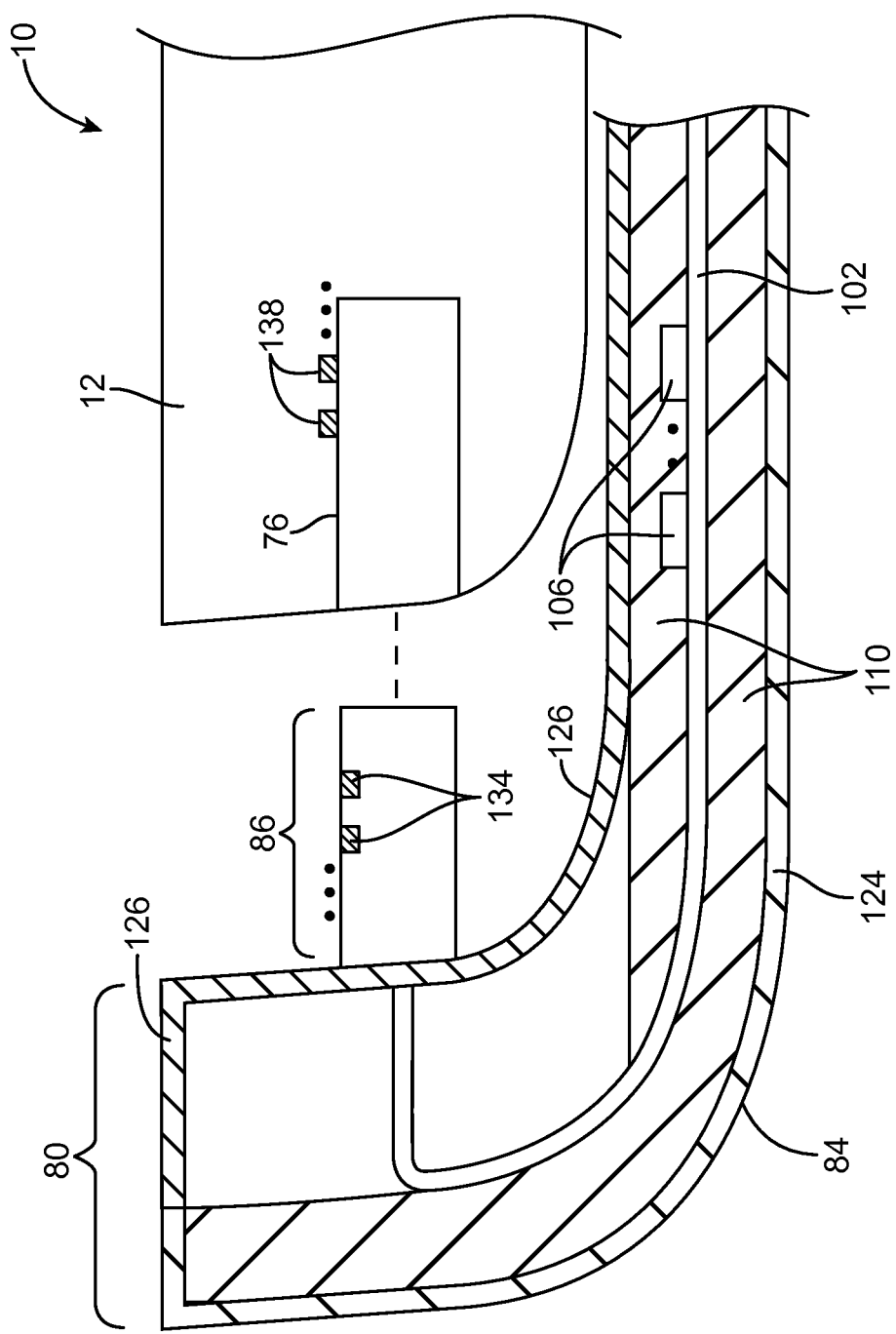
FIG. 11 is a cross-sectional side view of an illustrative electronic device and an associated external case showing how circuitry may be embedded within the external case in accordance with an embodiment.

FIG. 11 is a cross-sectional side view of an illustrative case and associated electronic device. As shown in FIG. 11, connector 76 of device 10 may have contacts (pins) 138. Mating connector 86 have corresponding contacts (pins) such as contacts 134. Connector 86 may be mounted to flexible printed circuit 102 so that contacts 134 are coupled to traces in flexible printed circuit 102 using coupling structures (e.g., solder and/or other conductive coupling structures, etc.). A support structure may be used in forming a protruding support member for contacts 134 and connector 86. The support structure may be a metal or plastic member that is supported by an elastomeric support structure such as an elastomeric gasket (e.g., a silicone gasket). The gasket may be flexible to allow connector 86 to shift slightly during insertion into mating connector 76. A metal bracket or other support structure mounted to housing 84 may be used to support the elastomeric gasket and connector 86.

Body 84 of case 80 may be formed from plastic 110 that has been injection molded over flexible printed circuit 102 and components 106. If desired, body 84 may have an outer cosmetic covering structure such as structure 124, an inner cosmetic covering structure such as structure 126. Structures such as structures 124 and 126 may be formed from metal members, plastic layers or injection-molded plastic structural features, pieces of metal, coating layers, fabric, or other structures. Flexible printed circuit 102 may contain signal lines that carry signals between contacts 134 on connector 86 and circuitry such as circuitry 106 on printed circuit 102 and elsewhere in case 80. Because the circuitry of components 106 is embedded within injection-molded plastic 110, this circuitry is shielded from moisture. Because printed circuit 102 is embedded within injection-molded plastic 110, printed circuit 102 is shielded from moisture, consumes minimal space within case 80, and is hidden from view by a user of case 80 and device 10.

Figure 12:
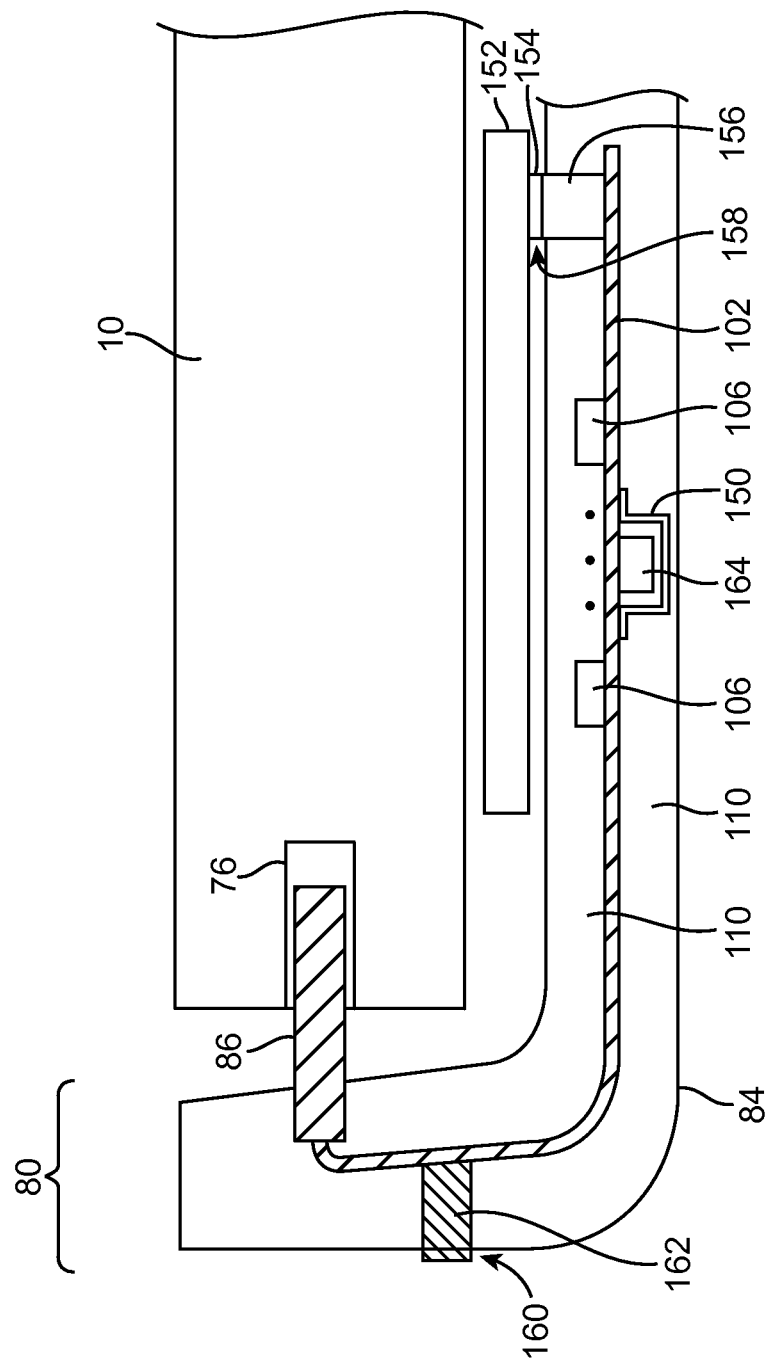
FIG. 12 is a cross-sectional side view of an illustrative electronic device and an associated external case showing how shielding structures, connectors, and other components may be mounted within the case in accordance with an embodiment.

As shown in the illustrative configuration of FIG. 12, some of the electrical components on flexible printed circuit 102 such as component 164 may be shielded using electromagnetic interference shielding structures such as shield 150. Shield 150 may be soldered to printed circuit 102 and may have a can shape that encloses component 164. Shield 150 may be embedded within injection-molded plastic 110 when injection-molded plastic 110 is injection molded over printed circuit 102.

Case 80 may have a battery such as battery 152. Battery 152 may have a connector such as connector 154. Printed circuit 102 may have a connector such as connector 156 with a portion that is embedded within injection-molded plastic 110 and a portion such as portion 158 that protrudes out of plastic 110 and is therefore not covered with plastic 110. Connectors 156 and 154 may mate with each other so that battery 152 can supply power supply signals to printed circuit 102.

Other components on printed circuit 102 may protrude out of plastic 110, if desired. As shown in FIG. 12, for example, a component such as component 162 may have a portion such as portion 160 that protrudes out of plastic 110 and is therefore not covered with plastic. Component 162 may be a button, sensor, connector, or other electrical component that is soldered or otherwise mounted to printed circuit 102 (see, e.g., the components of FIG. 5). Components such as component 162 and 156 may protrude out of plastic 110 in the interior of housing 84 of case 80, may protrude through an exterior surface of housing 84, may protrude out of an end wall or side wall of housing 84, or may protrude out of other surfaces of housing 84. The configuration of FIG. 12 is merely illustrative.

Figure 13:
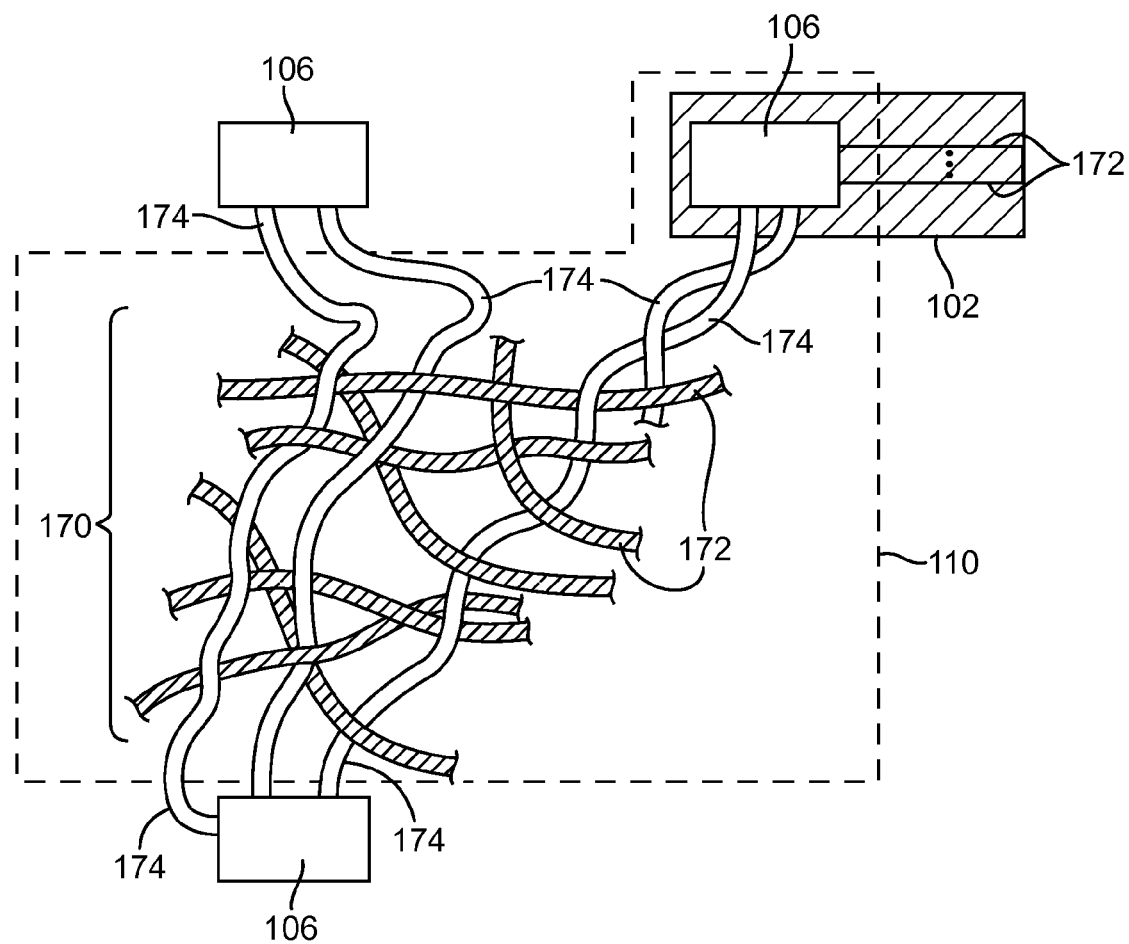
FIG. 13 is a diagram showing how signal wires may make up part of a mesh of interlaced fibers that are encased within injection molded plastic in accordance with an embodiment.

Signals may be conveyed between electrical components 106 using wires. This type of signal path arrangement is shown in FIG. 13. In the example of FIG. 13, fibers 170 are interlaced to form a mesh. Plastic 110 may be injection molded over the mesh formed from fibers 170. The presence of fibers 170 may help to strengthen plastic 110. Fibers 170 may include plastic fibers, wires that do not carry signals, or other fibers that do not convey signals such as non-signal fibers 172. Fibers 170 may also include wire (e.g., bare metal wire and/or plastic coated metal wire) such as wire 174 that serve as signal paths between electrical components 106. Components 106 may be mounted on substrates such as illustrative printed circuit 102. Plastic 110 may be molded over one or more of components 106 and/or some or all of printed circuit 102, as shown in FIG. 13. Plastic 110 may form part of housing 12, part of case body 84, or other structures. During operation, wires 174 may convey electrical signals (e.g., data and/or power supply signals). Interconnects formed from metal traces on printed circuit 102 such as traces 172 may also convey signals.

Figure 14:
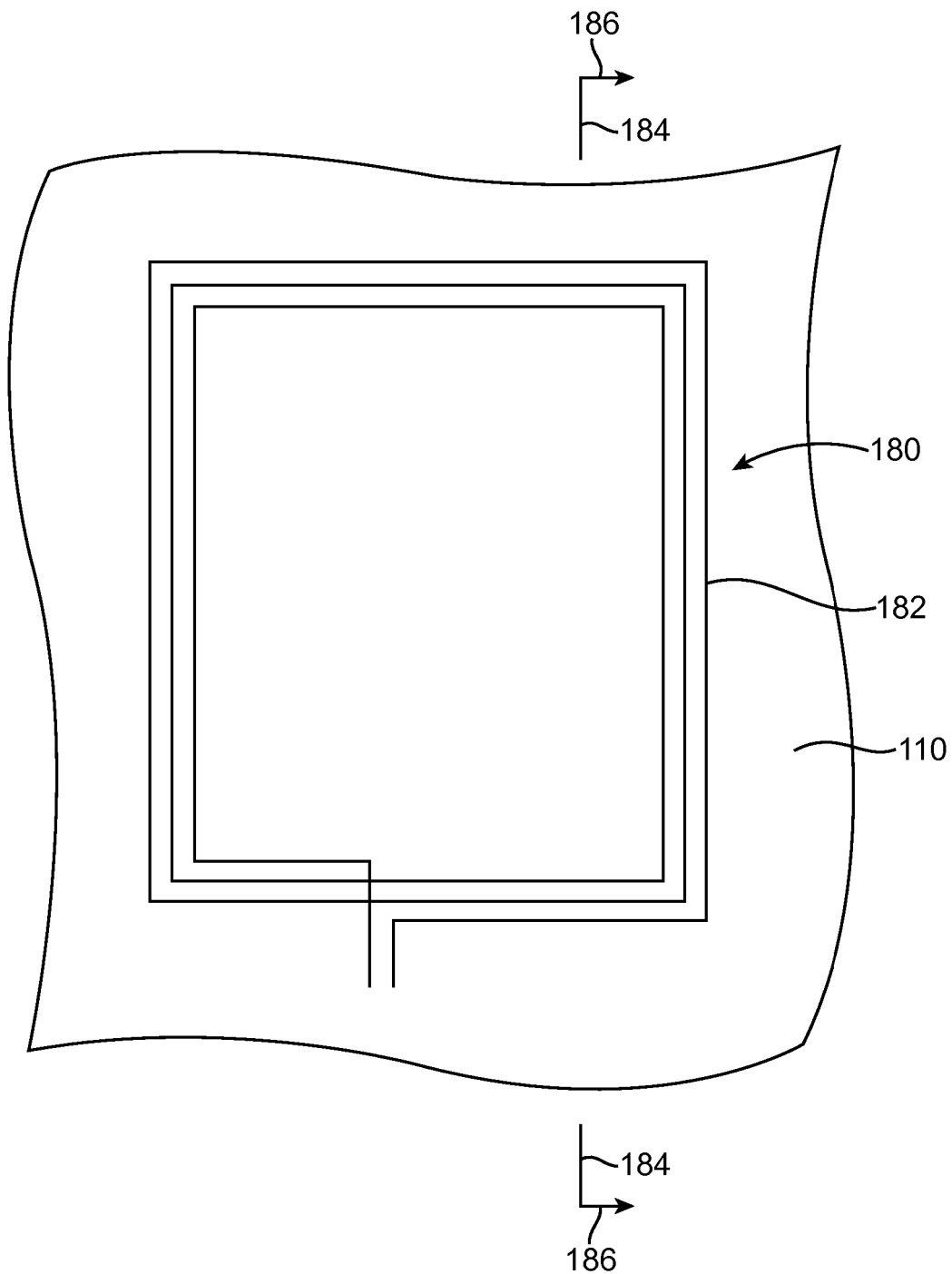
FIG. 14 is a top view of an illustrative injection molded plastic structure that contains a looped set of conductive lines for a near-field communications antenna in accordance with an embodiment.

If desired, a near-field communications antenna (e.g., an inductive loop antenna) may be embedded within plastic 110 for housing 12, housing 84, or other structures. This type of configuration is shown in FIG. 14. As shown in FIG. 14, near-field communications antenna 180 may be formed from one or more concentric loops of metal such as metal loops 182. Injection-molded plastic 110 (e.g., for housing 12, housing 84, or other structures) may be injection molded over loops 182, thereby embedding antenna 180 within plastic 110. Loops 182 may be formed from metal traces on a substrate such as a printed circuit, bare metal wires, plastic coated metal wires, stamped metal foil, metal traces on a plastic carrier, or other signal paths. There may be any suitable number of loops 182 in near-field communications antenna 180. The example of FIG. 14 in which there are three loops in antenna 180 is merely illustrative.

Figure 15:
FIG. 15 is a cross-sectional side view of an illustrative housing for an electronic device or other molded plastic structure containing an embedded near-field communications antenna such as the antenna of FIG. 14 in accordance with an embodiment.

A cross-sectional side view of an illustrative plastic structure such as the structure of FIG. 14 taken along line 184 and viewed in direction 186 is shown in FIG. 15. As shown in FIG. 15, structure 190 may have concentric signal paths (e.g., metal wires, metal traces, etc.) such as metal lines 182 that are embedded within injection-molded plastic 110 and that form near-field communications antenna 180 (e.g., an inductive loop). Structure 190 may be a structure such as body 84 of case 80, housing 12 of device 10, or other device structure.

Structure 190 may include embedded signal paths 192. Signal paths 192 may be formed from wires, flexible printed circuit 102, or other signal path structures. Signal paths 192 may couple near-field antenna 180 to other circuitry in structures 190 (e.g., connector 86, electrical components such as near-field communications transceiver circuitry and other wireless communications circuitry 34, other circuitry of the type shown in FIG. 5, etc.). By embedding near-field antenna wires 182 for near-field antenna 180 in plastic 110, near-field communications antenna 180 may be placed close to outer surface 194 of structures 190 so that signal losses in plastic 110 may be minimized.

The foregoing is merely illustrative and various modifications can be made by those skilled in the art without departing from the scope and spirit of the described embodiments. The foregoing embodiments may be implemented individually or in any combination.

What is claimed is:

1. A case configured to receive an electronic device, comprising:
    a connector that mates with a corresponding connector in the electronic device;
    an injection-molded plastic body;
    a flexible printed circuit that is at least partially embedded within the injection-molded plastic body and that is coupled to the connector;
    an electrical component mounted to the flexible printed circuit; and
    a metal electromagnetic interference shield that is mounted to the flexible printed circuit and embedded within the injection-molded plastic body, wherein the metal electromagnetic interference shield surrounds and shields the electrical component.

2. The case defined in claim 1 wherein the electrical component comprises a system-in-package circuit module.

3. The case defined in claim 2 wherein the system-in-package circuit module comprises integrated circuits mounted to a substrate and enclosed in a polymer on the substrate.

4. The case defined in claim 1 further comprising an additional connector having a portion that protrudes through the injection-molded plastic body and is not covered by the injection molded plastic body.

5. The case defined in claim 4 wherein the additional connector is coupled to a battery connector.

6. The case defined in claim 1 further comprising a near-field communications antenna embedded within the injection-molded plastic body.

7. The case defined in claim 1 further comprising a flap that is coupled to the injection-molded plastic body and that rotates relative to the injection-molded plastic body.

8. A case configured to receive an electronic device, the case comprising:
    a plastic body;
    a flexible printed circuit embedded within the plastic body, the flexible printed circuit comprising a flexible printed circuit connector that protrudes out of the plastic body;
    a case connector that is electrically coupled to the flexible printed circuit, wherein the case connector protrudes from the plastic body and is configured to mate with a mating connector of the electronic device;

a battery comprising a battery connector that mates with the flexible printed circuit connector that protrudes out of the plastic body wherein the battery provides power to the electronic device through the case connector; and an electronic component that is mounted on the flexible printed circuit and embedded within the plastic body.

9. The case defined in claim 8 further comprising:

an electromagnetic interference shielding structure embedded within the plastic body, wherein the electromagnetic interference shielding structure is mounted to the flexible printed circuit and surrounds the electronic component.

10. The case defined in claim 8 further comprising:

a near-field communications antenna embedded within the plastic body.

11. The case defined in claim 10, wherein the near-field communications antenna is electrically coupled to the case connector.

12. A case for an electronic device, the case comprising:

a near-field communications antenna comprising a plurality of conductive loops;

a flexible printed circuit that is electrically coupled to the near-field communications antenna;

a connector that mates with a mating connector in the electronic device to couple the near-field communications antenna to the electronic device through the flexible printed circuit;

an electronic component mounted to the flexible printed circuit; and an injection-molded plastic body that at least partially surrounds the near-field communications antenna, the flexible printed circuit, the connector, and the electronic component, wherein at least a portion of the injection-molded plastic body is interposed between the plurality of conductive loops of the near-field communications antenna.

13. The case defined in claim 12 further comprising:

a battery that is electrically connected to the flexible printed circuit and that provides power to the electronic device through the connector.

14. The case defined in claim 12 further comprising:

an additional connector that protrudes from the injection-molded plastic body.

\* \* \* \* \*